United States Patent [19]
Gandre

[11] Patent Number: 5,850,925
[45] Date of Patent: Dec. 22, 1998

[54] RACK MOUNT MECHANISM FOR MID-TOWER TYPE COMPUTER ENCLOSURE

[75] Inventor: Jerry D. Gandre, Austin, Tex.

[73] Assignee: Dell USA, L.P., Round Rock, Tex.

[21] Appl. No.: 756,449

[22] Filed: Nov. 26, 1996

[51] Int. Cl.$^6$ ..................................................... A47F 7/00
[52] U.S. Cl. ..................... 211/26; 211/26.2; 312/223.3; 361/727; 361/825
[58] Field of Search ................... 211/26, 162; 312/223.2, 312/223.3, 334.12, 334.18; 361/683, 724, 725, 727, 825; 248/285.1, 286.1, 917, 918, 919, 920

[56] References Cited

U.S. PATENT DOCUMENTS

| | | | |
|---|---|---|---|
| 686,777 | 11/1901 | Snook | 312/334.12 |
| 1,534,201 | 4/1925 | Blin | 312/334.12 |
| 2,475,284 | 7/1949 | Houpt | 312/334.18 X |
| 2,630,364 | 3/1953 | Gleason | 312/334.12 X |
| 4,498,123 | 2/1985 | Fuss et al. | 361/825 |
| 4,659,048 | 4/1987 | Fahrion | 248/920 X |
| 5,302,015 | 4/1994 | DuVall | 248/286.1 X |
| 5,385,487 | 1/1995 | Beitman | 361/727 X |
| 5,460,441 | 10/1995 | Hastings et al. | 361/610 X |
| 5,508,891 | 4/1996 | Rowe et al. | 361/727 X |
| 5,586,003 | 12/1996 | Schmitt et al. | 361/727 X |
| 5,626,323 | 5/1997 | Lechman et al. | 248/286.1 |

OTHER PUBLICATIONS

"Electronic Packaging Solutions", General Devices Company, Inc., Indianapolis, Indiana (1991).

*Primary Examiner*—Blair Johnson
*Attorney, Agent, or Firm*—Skjerven, Morrill, MacPherson, Franklin & Friel, L.L.P.; Mark Zagorin

[57] ABSTRACT

A rack mount mechanism for a computer enclosure includes a trolley, a bracket which is rotatably coupled to the trolley which supports the computer enclosure, and fixed first and second bars on which the trolley is slidably coupled. The trolley can be placed in an extended position allowing the bracket supporting the computer enclosure to rotate 90 degrees. The computer enclosure can be slid out of the rack by sliding the trolley along the bars, rotated to a standing position supported by the bracket, serviced, rotated back to a horizontal position, and returned into the rack, all without detaching or removing the computer from the rack.

21 Claims, 6 Drawing Sheets

5,850,925

RACK MOUNT MECHANISM FOR MID-TOWER TYPE COMPUTER ENCLOSURE

BACKGROUND OF THE INVENTION

1. Field of the Invention

This invention relates to computer enclosures and more specifically to mounting computer enclosures in a rack.

2. Description of the Related Art

A rack is a compartment that can contain a number of computer enclosures. One way to mount a computer enclosure in a rack is to simply place the computer enclosure on a shelf in the rack. That is shown, for example in FIG. 1a, where computer enclosure 110 is shown on its side in rack 120. For mid-tower type computer enclosures, which are designed to stand vertically rather than lay flat, several problems with rack mounting present themselves. For instance, when a mid-tower type computer enclosure is rack mounted by laying it on its side, for service or other access, the user has to pull the computer off the shelf and place the computer upright or pull the shelf out and manually place the computer in a standing position on its shelf. Alternatively, one can place a computer standing up on a shelf as shown in FIG. 1b, but this may result in a lower number of computers fitting into the rack. In fact, some mid-tower computer enclosures are now too wide to fit two enclosures standing side-by-side on a shelf surface in a standard 19 inch rack. It is possible to specifically design a mid-tower computer enclosure for rack mounting. However, such a specifically designed enclosure does not work well for free-standing uses in all cases.

It would be desirable to access rack mounted computers for service without the need to remove them from the shelves. Rack slides are known that have small ends that rotate in a plane parallel with the sides of the rack. Rack slides of that type allow tilting an electronic enclosure towards the user. However, such rack slides do not provide for removal of a standard mid-tower computer enclosure from a rack, and rotation of 90 degrees for service and general access while still attached to the rack mechanism.

SUMMARY OF THE INVENTION

Accordingly, the invention provides a rack mount mechanism that includes a trolley, a bracket rotatably coupled to the trolley, for supporting a computer enclosure, and fixed first and second bars on which the trolley is slidably mounted. The trolley has a stowed position at one end of the bars and an extended position near an opposite end of the bars, the extended position allowing the bracket supporting the computer enclosure to rotate 90 degrees. Thus, the rack mount mechanism of the present invention provides easy and quick access to a mid-tower enclosure mounted in a rack. By use of the rack mount mechanism of the present invention, one can remove a mid-tower computer enclosure from a rack by sliding the trolley along the bars to an extended position, rotate the enclosure 90 degrees for service and general access while the enclosure is still attached to the rack mount mechanism, rotate the computer enclosure back to a horizontal position, and slide the computer, bracket and trolley back into the rack returning them to a stowed position, all without detaching or removing the computer from the rack. The rack mount mechanism of the present invention has the additional advantage over vertically stowed computer enclosures, of allowing the number of computers per rack to be increased.

BRIEF DESCRIPTION OF THE DRAWINGS

The present invention may be better understood, and its numerous objects, features, and advantages made apparent to those skilled in the art by referencing the accompanying drawings, wherein the use of the same reference symbols in different drawings indicates similar or identical items.

FIG. 3d-1 and 3d-2, collectively referred to as FIG. 3d, show locking mechanism for the pivot mechanism.

DESCRIPTION OF THE PREFERRED EMBODIMENT(S)

Figure 1A:
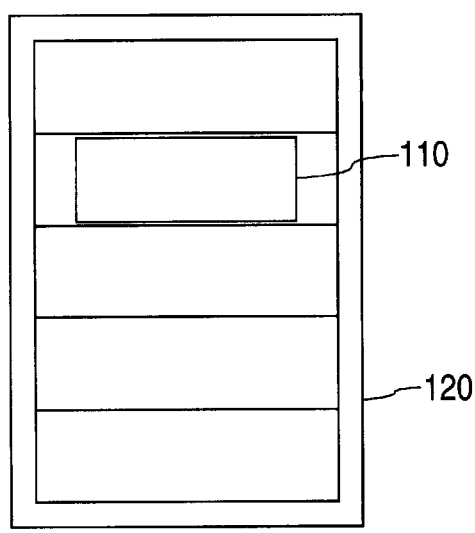
FIG. 1a is a rack containing a computer enclosure stowed in a horizontal position.
Figure 1B:
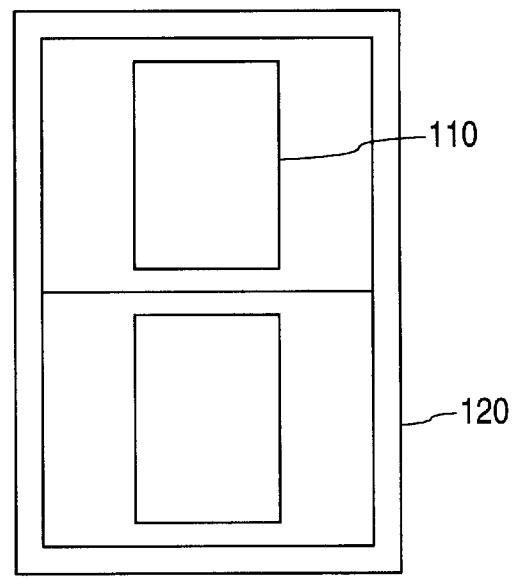
FIG. 1b is a rack containing a computer enclosure stowed in a vertical position.
Figure 2:
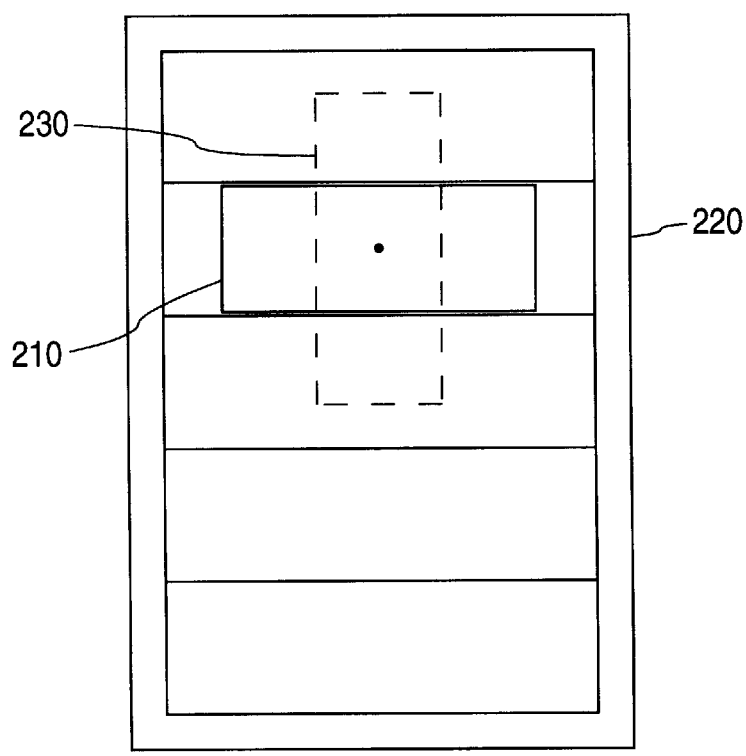
FIG. 2 shows a rack mounted computer system according to the present invention.

The rack mounted computer system of the present invention is shown in FIG. 2. Computer enclosure 210 is mounted horizontally in rack 220. However for service, computer enclosure 210 can be pulled from the rack and rotated 90 degrees to position 230 to allow removal of the cover and other service to be performed as needed. The rack mounted system allows the computer 210 to remain attached to rack 220.

Figure 3A:
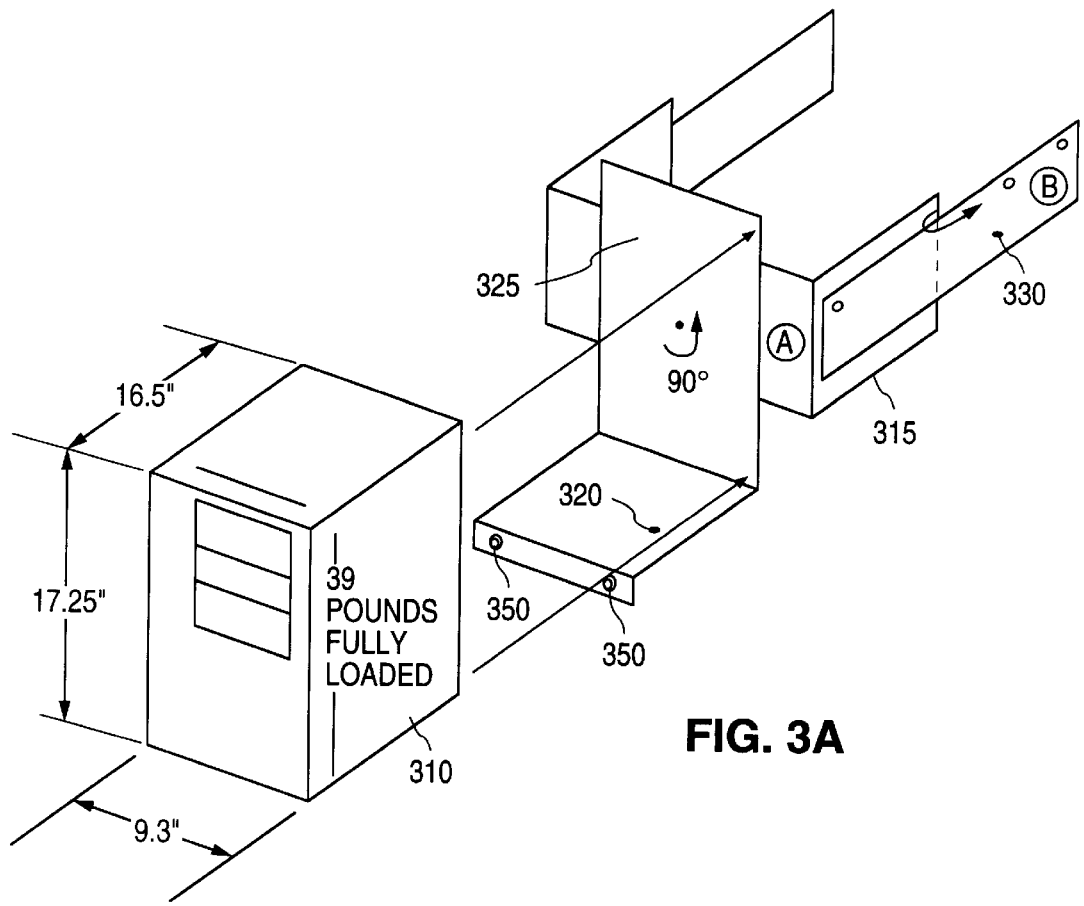
FIG. 3a shows a perspective view of the rack mount mechanism and computer enclosure.
Figure 3B:
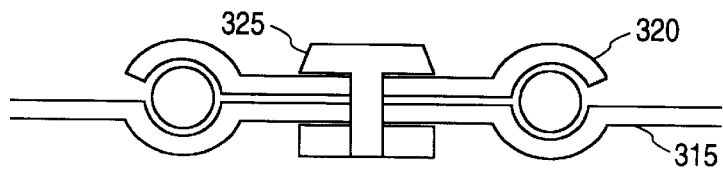
FIGS. 3b and 3c show several pivoting mechanisms.
Figure 3C:
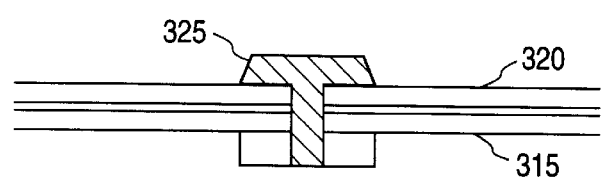

Referring now to FIG. 3a, computer enclosure 310, has typical dimensions of 17.25 inches high, 9.3 inches deep and 16.5 inches in depth, and can weigh 39 pounds fully loaded. Computer enclosure 310 is attached to bracket 320 which can support the computer enclosure in an upright or horizontal position. Bracket 320 is mounted to trolley 315 at pivot mechanism 325. Pivot mechanism 325 may be any of a number of different pivoting mechanisms, e.g., as shown in FIGS. 3b and 3c. Numerous variations of the exemplary pivoting mechanisms would be known to one of ordinary skill in the art.

Bracket 320 attaches to the bottom and back of mid-tower computer enclosure 310. The attachment may be by means of screws or other fasteners sufficient to withstand the load when, for example, the computer enclosure is extended and in the horizontal position. The bracket may be L-shaped as shown in FIG. 3a or may assume a shape to provide access to such areas as the input/output area (such as expansion card connections, mouse, keyboard, serial ports), air exhaust and power supply. Thus, the portion of the bracket on the back of the computer enclosure may assume a shape to avoid such areas, although the bracket will still be in a plane perpendicular to the portion of the bracket at the bottom of the computer enclosure, and thus generally L-shaped. Alternatively or in addition, the bracket portion on the back of the computer enclosure may be spaced at some distance from the back of the computer enclosure, to provide sufficient clearance for I/O and air. Additionally, the portion of the bracket on the back of the computer enclosure may have a hole cut out to provide I/O access for wires and air exhaust.

Figures 1, 3D:
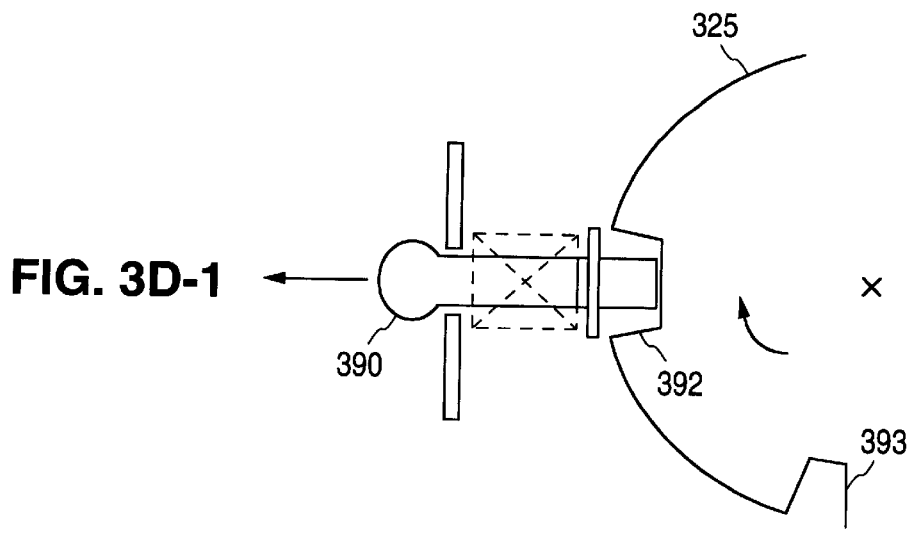
Figures 2, 3D:
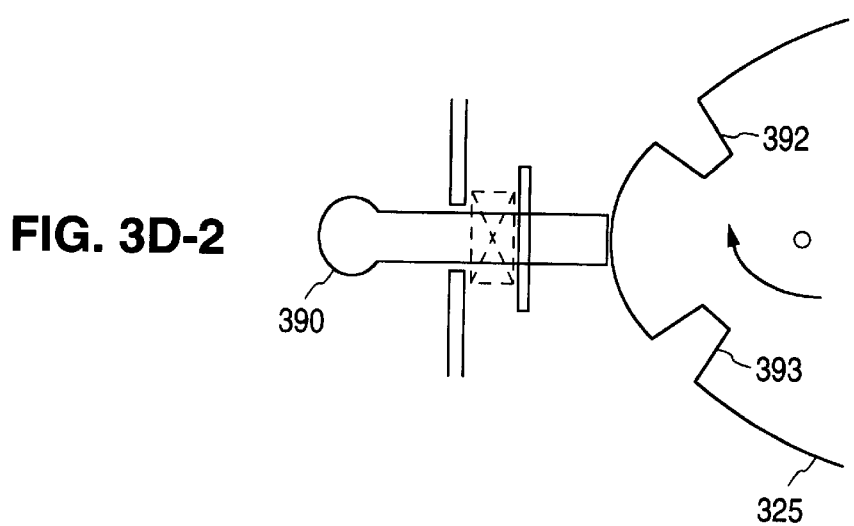
Figure 3E:
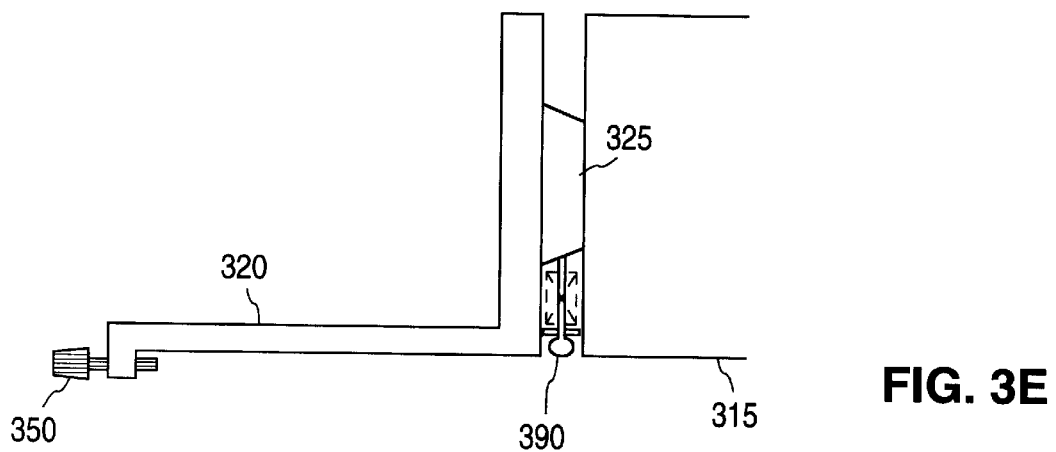
FIG. 3e shows a top view of the locking mechanism for the pivot mechanism.
Figure 3F:
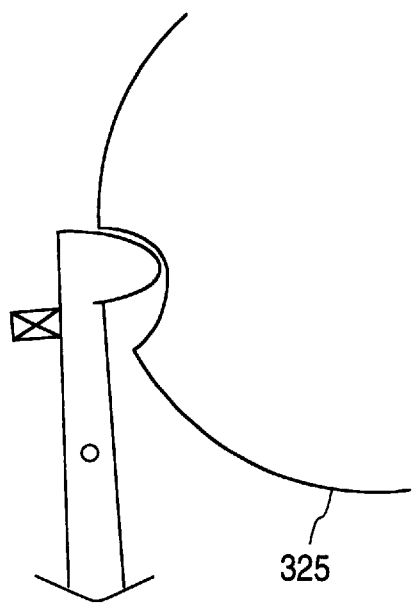
FIG. 3f shows another locking mechanism for the pivot mechanism.

In one preferred embodiment, the bracket 320 can be locked into either of two rotation positions. For instance, referring to FIG. 3d, the pivot mechanism can include a spring loaded pin 390 which fits into recesses 392 and 393 which are spaced 90 degrees apart. FIG. 3d shows pin 390 engaged in hole 392 and also when pin 390 has been retracted and the pivot mechanism 325 has been partially rotated. A top view of the locking mechanism of FIG. 3d is shown in FIG. 3e. Other locking mechanisms can also be used, e.g., the locking mechanism illustrated in FIG. 3f.

Figure 4:
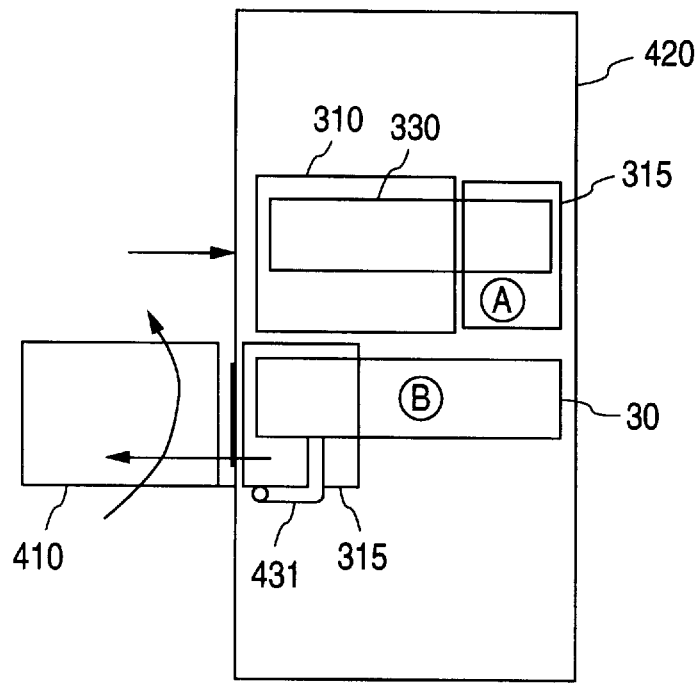
FIG. 4 shows a side view of the computer enclosure, bracket, trolley and bars.

Trolley 315, which attaches to bracket 325 is, in one preferred embodiment, a U shaped metal piece, which slides along bars 330. Bars 330 are mounted in the rack by bolts or other suitable attaching devices. Trolley 315 provides for both relatively long travel of the mounting mechanism along the bars and also is sufficiently strong to bear the relatively heavy load of a fully loaded computer enclosure. As seen in FIG. 4, the trolley is limited in length to the area between the back of the computer enclosure 310 and the wall of the rack 420. At the top of FIG. 4, the computer enclosure 310 and trolley 315 are shown in a retracted position in rack 420 with trolley 315 being in a position towards one end of the bars 330. At the bottom of FIG. 4, computer enclosure 310 is shown in a position outside rack 420. To extend the computer enclosure outside of the rack, trolley 315 must be moved to a position along the bars 330, opposite to the retracted position, sufficient to allow the bracket 320 with the computer enclosure attached, to rotate 90 degrees. A stabilizer 431 may be utilized when the computer enclosure and trolley are in the stowed position to provide additional support for the computer enclosure.

Figure 5:
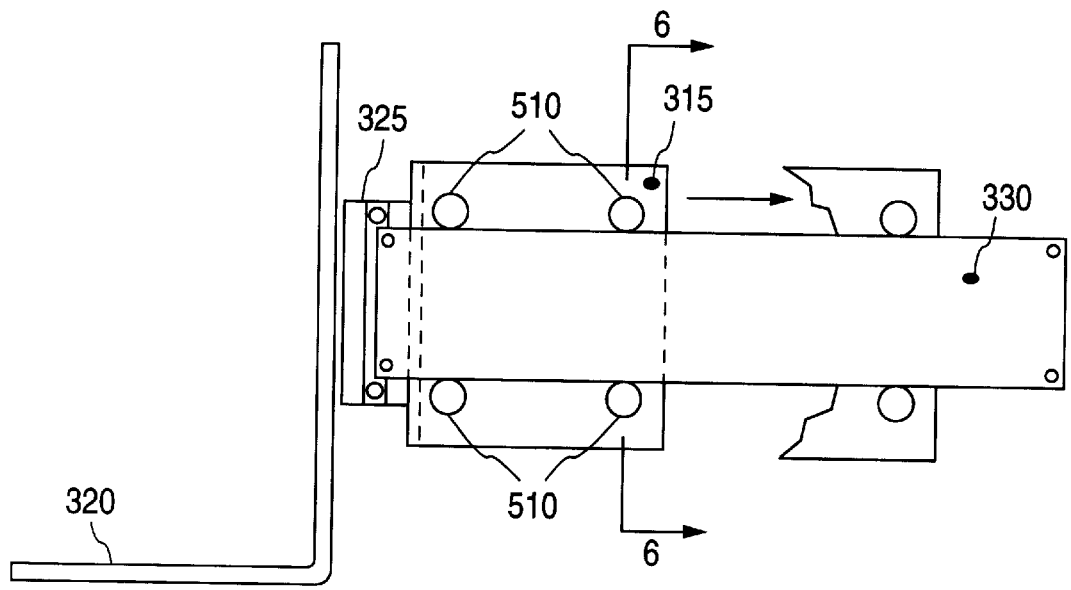
FIG. 5 shows a side view of the bracket, trolley and bars.
Figure 6:
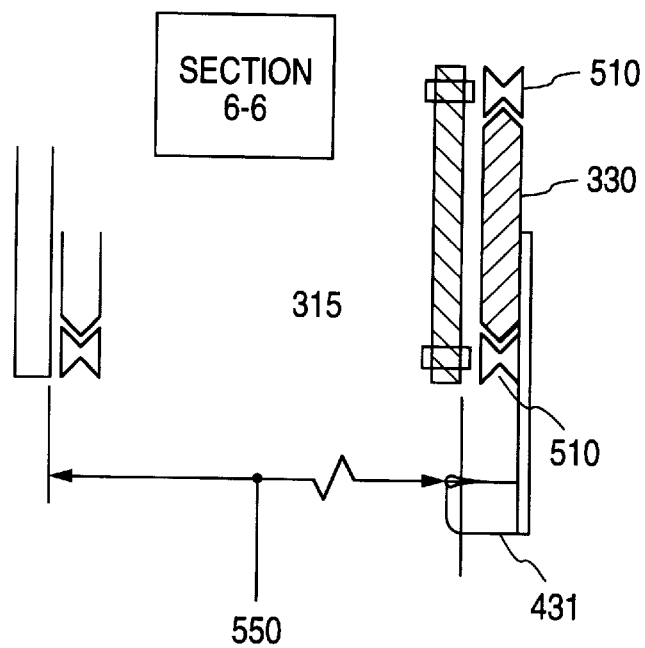
FIG. 6 shows a section view of the trolley and bars.

Referring now to FIG. 5, a side view shows the bracket 320, the trolley 315 and the bars 330 in more detail. The trolley contains rollers 510 on its outer sides. In one preferred embodiment the rollers are "V" groove rollers. In that embodiment, the bars 330 have a raised "V" shape along the long edges of the bar to mate with the "V" groove rollers 510. The section view in FIG. 6 shows the "V" groove rollers 510 attached to trolley 315 and the raised "V" shape along the edges of the bars 330 mating with the "V" groove rollers 510.

The trolley design solves the problem of a relatively long travel of the rack mount mechanism, from a stowed to an extended position, combined with the need for strong bearing over a short distance, the short distance being the amount of room left between the back of the computer enclosure and the back wall of the rack. The long travel is needed to have the computer enclosure extend completely out of the front of the cabinet for rotation and access. Note that the computer enclosure 310 has to fit within the width shown at 550.

Figure 7:
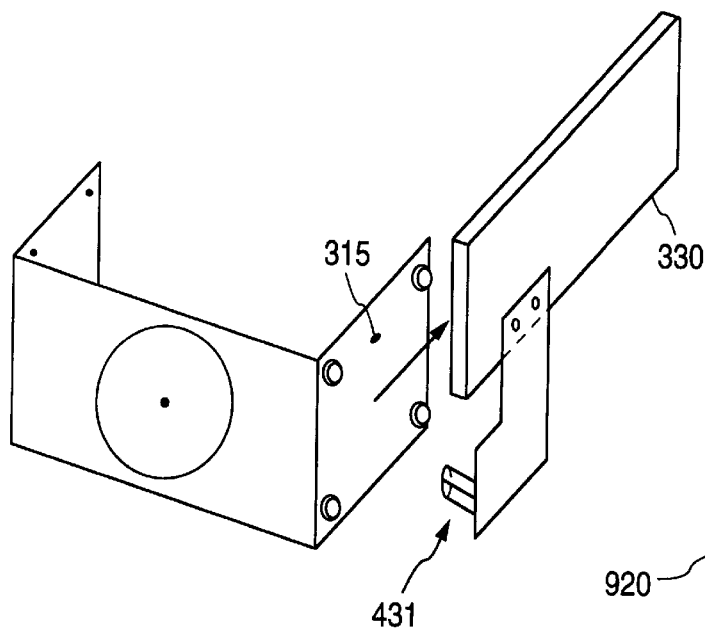
FIG. 7 shows an exploded view of the trolley, bar and stabilizer.

FIG. 7 shows an exploded view of trolley 315, bar 330 and provides a view of stabilizer bar 431. Stabilizer bar 431 supports the corner of computer enclosure 310, when it is in the stowed position.

Figure 8:
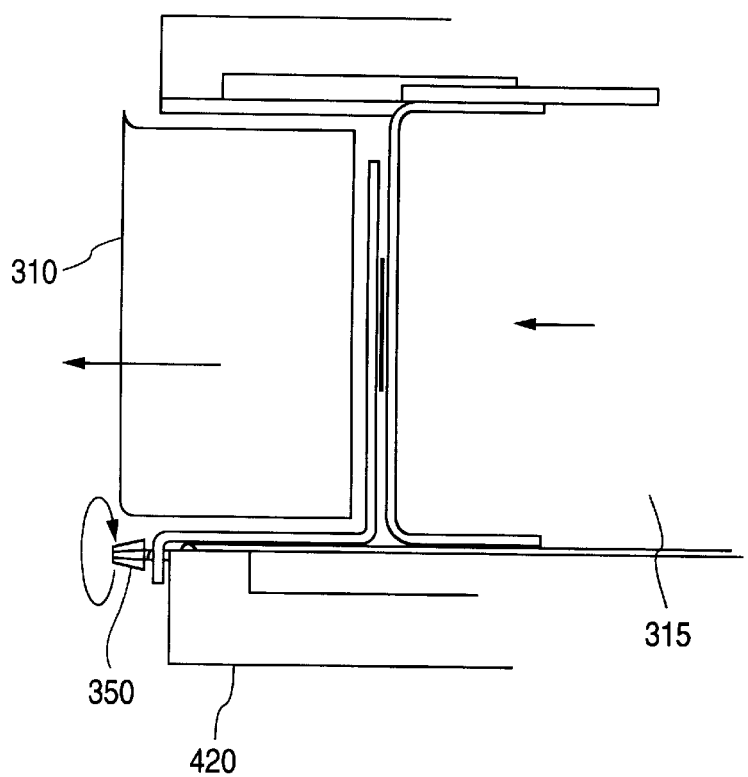
FIG. 8 shows a top view of the rack mount mechanism.

Additionally, the bracket can have a feature to allow securing the rack mechanism, with the computer enclosure attached, to standard threaded holes on the front of a standard rack when in the stowed position. One way to implement that additional feature is shown in FIG. 8 which shows a top view of the rack mount mechanism. One or more thumbscrews 350 secure the computer enclosure 310 and the trolley 315 to rack 420 when the trolley is in the stowed position. Other securing mechanisms which may or may not attach to the bracket are of course possible.

Figure 9:
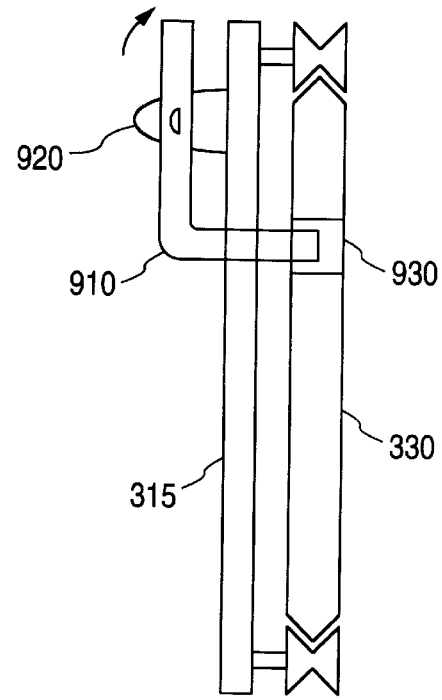
FIG. 9 shows a locking mechanism for the rack mount mechanism when the trolley is in the extended position.

A locking mechanism can be used to lock the trolley to the stationary bars when the trolley is pulled all the way out into the extended position. One example of a locking mechanism is shown in FIG. 9. A spring loaded pivoting arm 910 attaches to trolley 315. One end of the arm fits into recess 930 in bar 330 to secure the trolley in position relative to the bar. In some embodiments it may be preferable to have a locking mechanism on each side of the trolley, to lock the trolley to each bar.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A rack mount mechanism for a computer enclosure comprising:

first and second bars fixed in a stationary position;
   a trolley slidably mounted on the first and second bars, the trolley being movable in a direction between a stowed position near one end of the bars and an extended position near an opposite end of the bars; and
   a bracket rotatably coupled to the trolley, the bracket being attachable to the computer enclosure and having an axis of rotation extending in the direction of trolley movement between the stowed and extended positions, and wherein the bracket includes a firstportion for engaging with a bottom of the computer enclosure and a second portion for engaging with a back of the computer enclosure, the first and second portions of the bracket forming an L shape.

2. The rack mount mechanism as recited in claim 1 wherein the trolley includes rollers on its outer sides.

3. The rack mount mechanism as recited in claim 2, wherein the rollers are 'V' groove rollers.

4. The rack mount mechanism as recited in claim 3, wherein each of the stationary bars include a raised 'V' shape along each long edge to slidably mate with the 'V' groove rollers on the trolley.

5. The rack mount mechanism as recited in claim 1, wherein the trolley is U-shaped, with the open end of the U facing the direction of the stowed position.

6. The rack mount mechanism as recited in claim 1, wherein the second portion of the bracket is configured to provide air clearance and input/output access to the back of the computer enclosure.

7. The rack mount mechanism as recited in claim 1 further comprising a rotational locking mechanism to lock the bracket into one of a first and second rotated positions, the first and second rotated positions being 90 degrees apart.

8. The rack mount mechanism as recited in claim 1 further comprising a retracted locking mechanism to lock the trolley in the retracted position.

9. The rack mount mechanism as recited in claim 8, wherein the retracted locking mechanism comprises a thumb screw integral with the bracket and threadably attachable to a frame containing the rack mount mechanism.

10. The rack mount mechanism as recited in claim 1, wherein the second portion of the bracket is configured to provide air clearance and input/output access to the back of the computer enclosure.

11. The rack mounted computer system as recited in claim 1, wherein the bars are attached to a rack having first and second side walls extending between a front and back of the rack, the first and second side walls enclosing the computer enclosure when the trolley is in the stowed position.

12. A method of mounting a computer enclosure in a rack, the rack including first and second bars fixed in a stationary position, a trolley slidably mounted on the first and second bars, the trolley having a stowed position near one end of the bars and an extended position near an opposite end of the bars, and an L-shaped bracket rotatably coupled to the trolley, the bracket being attached to the computer enclosure, comprising the steps of:

while the trolley is in the extended position, rotating the computer enclosure attached to the bracket 90 degrees about an axis of rotation extending in the direction of trolley movement between the stowed and extended positions, from a standing position to a horizontal position; and sliding the trolley from the extended position to the retracted position to horizontally mount the computer enclosure within the rack.

13. A method as recited in claim 12, further comprising the step of locking the trolley and computer enclosure within the rack when the trolley is in the retracted position.

14. A rack mounted computer system comprising:

a computer enclosure;

a rack mounting mechanism securing the computer enclosure, the rack mounting mechanism, including, first and second stationary bars, a trolley slidably mounted on the first and second stationary bars, the trolley having a stowed position at one end of the stationary bars and an extended position near an opposite end of the stationary bars, and a bracket rotatably coupled to the trolley, the bracket being attached to and supporting the computer enclosure, and wherein the trolley is slidable in a direction between the stowed position and the extended position and wherein the bracket has an axis of rotation extending in said direction.

15. The rack mounted computer system as recited in claim 14, further comprising a plurality of rollers disposed on the outer sides of the trolley.

16. The rack mounted computer system as recited in claims 15, wherein, the rollers are 'V' groove rollers; and the stationary bars include a raised 'V' shape along both long edges to slidably mate with the 'V' groove rollers on the trolley.

17. The rack mounted computer system recited in claim 14 wherein the computer enclosure is a mid-tower type computer enclosure.

18. The rack mounted computer system as recited in claim 14, wherein the trolley is U-shaped, with the open end of the U facing the direction of the stowed position.

19. The rack mounted computer system as recited in claim 14 wherein the extended position of the trolley allows the bracket, with the computer enclosure attached, to rotate 90 degrees.

20. The rack mounted computer system as recited in claim 19 wherein the computer enclosure is a mid-tower type computer enclosure.

21. A rack mount mechanism for a computer enclosure comprising:

first and second bar bars fixed in a stationary position;

a trolley slidably mounted on the first and second bars, the trolley having a stowed position near one end of the bars and an extended position near an opposite end of the bars;

a bracket rotatably coupled to the trolley, the bracket being attachable to the computer enclosure; and a retracted locking mechanism to lock the trolley in the retracted position, the retracted locking mechanism comprising a thumb screw integral with the bracket and threadably attachable to a frame containing the rack mount mechanism.

* * * * *